Sept. 29, 1964 R. A. LEIGHTNER 3,151,252
BIDIRECTIONAL DECADE COUNTER
Filed Dec. 28, 1959
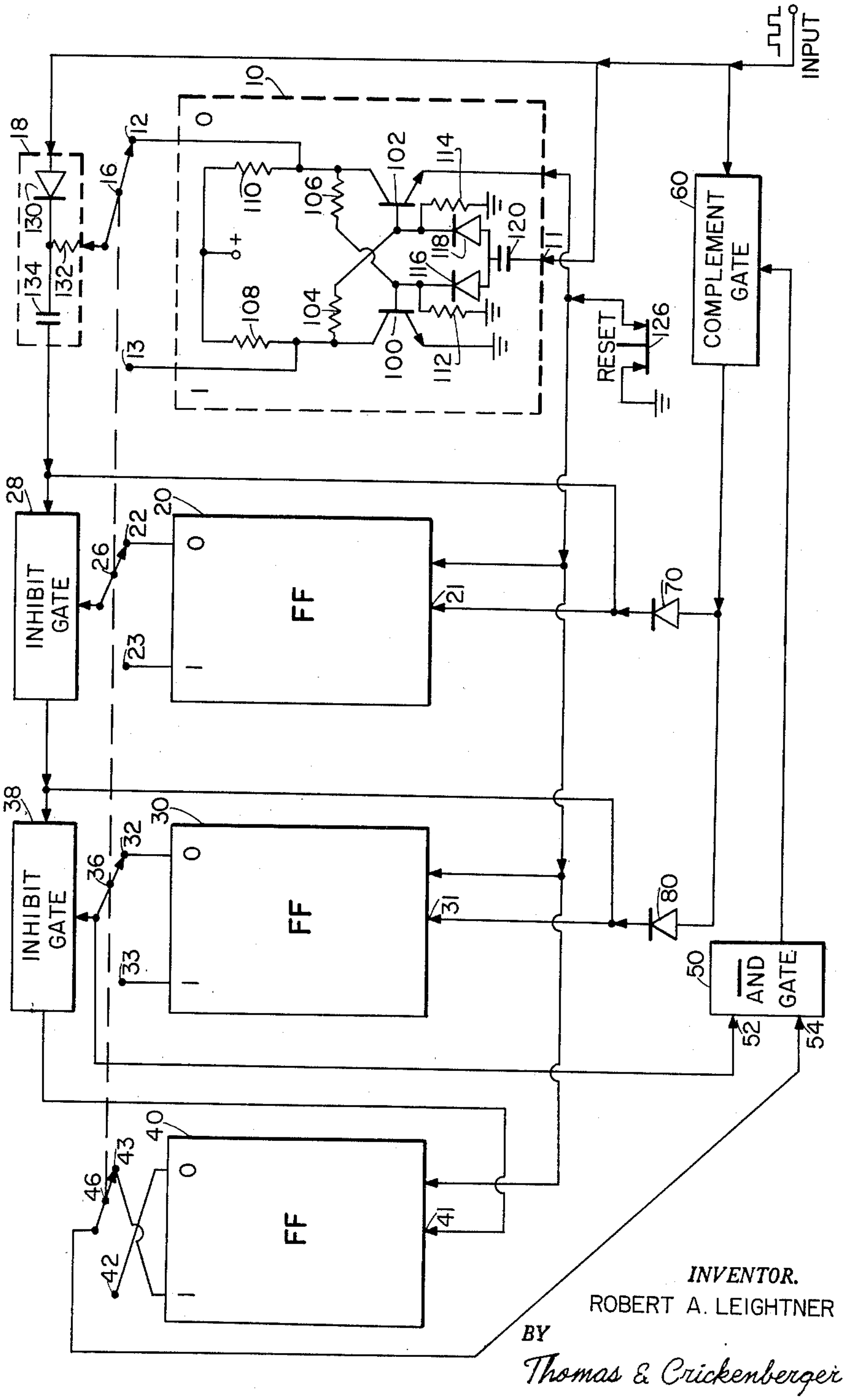
INVENTOR.
ROBERT A. LEIGHTNER
BY
*Thomas & Crickenberger*

3,151,252
Patented Sept. 29, 1964

3,151,252

BIDIRECTIONAL DECADE COUNTER

Robert A. Leightner, Tioga Center, N.Y., assignor to International Business Machines Corporation, New York, N.Y., a corporation of New York Filed Dec. 28, 1959, Ser. No. 862,341
9 Claims. (Cl. 307—88.5)

This invention relates to a counting device and more particularly to a decade counting device capable of bidirectional counting operations.

Counters may be defined generally as devices capable of changing from one to the next of a sequence of distinguishable states upon each receipt of a discreet input signal. Certain bidirectional counters employ a plurality of stages of bistable devices, such as flip-flops, each stage of which includes a plurality of gates. Each of these gates is arranged to be conditioned by the flip-flop in its stage to provide a carry signal, or pass an input pulse, to the next succeeding stage. In certain bidirectional counters, the flip-flop of one stage is fed from the flip-flop of the preceding stage thereby resulting in a cumulative time delay. In other bidirectional counters, the input pulses are applied to each stage and two or more gates are employed in each stage to gate the input pulses.

Counters find extensive uses in a variety of computing applications. It is desirable that such counters operate at rates as high as possible. It is also desirable to construct such counters from a minimum number of standard components to achieve standardization and minimize construction cost.

In accordance with the present invention, a bidirectional counter is provided which includes a plurality of substantially identical stages. Each of these stages includes a bistable device, such as a flip-flop. Certain of the stages include a single gate which is conditioned by the flip-flop of that stage to pass, or block, an input signal to the flip-flop of the next succeeding stage. An $\overline{\text{AND}}$ (negative AND) gate is connected to the last two flip-flops of the counter. Upon the occurrence of a particular count in the counter, the $\overline{\text{AND}}$ gate conditions a complement gate to trigger certain of the flip-flops upon the reception of the next input pulse. Input pulses cause the binary states of the flip-flops of the counter to advance from 0 through 4 and then 11 through 15 when adding which represents a decimal count of input pulses 0 through 9. When the counter is subtracting, the binary states of the flip-flops decrease from 15 through 11 and then 4 through 0. The particular scheme of counting employed greatly reduces the total number of components required.

Another feature of the present invention resides in the particular gating arrangement which results in a negligible current requirement in the control input of the gate thereby allowing a high impedance to be used between the gate control terminal and the flip-flop output. The use of such a high impedance prevents the counter from changing its accumulated total when it is switched from the add mode to the subtract mode.

A further feature of the present invention is in the provision of a bidirectional counter employing bistable devices all of which are fed input pulses. This arrangement removes the successive amplifications of noise and cumulative time delays present in similar counters employing cascaded flip-flops.

Another feature of the present invention is in the provision of a counter employing a plurality of transistorized flip-flops which are reset to a predetermined state by opening a ground connection to one of the transistors of each of the flip-flops. This arrangement results in a savings of a number of components over prior transistor counters.

These and other features of this invention may be more fully appreciated when considered in light of the following specification and the single figure of the drawing which illustrates a bidirectional decade counter in accordance with the principles of the instant invention.

Referring to the drawing, a four stage bidirectional decade counter is shown in block diagram form. The flip-flops and the inhibit gates employed in each stage of the counter are substantially identical, and a description of one stage should suffice for an understanding of the construction of the remaining stages. A detailed circuit diagram of the flip-flop and the gate of only the first stage is illustrated.

The bidirectional decade counter illustrated in the drawing is comprised of four stages defined by a flip-flop 10 and an inhibit gate 18, a flip-flop 20 and an inhibit gate 28, a flip-flop 30 and an inhibit gate 38, and flip-flop 40. Each of the stages of the counter also includes an add-subtract mode switch 16, 26, 36 and 46. These mode switches are arranged so that they operate together. Although a mechanical type mode switch is illustrated, it is to be understood that other types of switches, such as electronic switches, may be employed. An electronic switch is preferred for use as the mode switch, but a mechanical type switch is shown for simplicity of illustration.

The inhibit gates 18, 28 and 38 are connected in series with the input pulse source. Each of these gates is conditioned by the state of its associated flip-flop, 10, 20 and 30, respectively, to pass or block input pulses as will be explained in greater detail hereinafter. The input pulses are applied to an input terminal 11 of the flip-flop 10 and to the series circuit including the inhibit gates 18, 28 and 38. When an input pulse passes through the inhibit gate 18, it is applied to the inhibit gate 28 and an input terminal 21 of the flip-flop 20. When a pulse is passed by the inhibit gate 28, it goes to the inhibit gate 38 and an input terminal 31 of the flip-flop 30. A pulse passed by the inhibit gate 38 is applied to an input terminal 41 of the flip-flop 40. The input terminals 11, 21, 31 and 41 of the flip-flops 10, 20, 30 and 40, respectively, are trigger or complement inputs. Therefore, when a pulse is applied to any of these inputs, the associated flip-flop is caused to change state, i.e., from the One to the Zero state or vice versa.

According to a feature of this invention, a complement gate 60, which is an inhibit circuit, is employed to complement the flip-flops 20, 30 and 40 during particular phases of the operation of the bidirectional counter. The complement gate 60 is conditioned by the output from an $\overline{\text{AND}}$ (negative AND) gate 50 to pass an input pulse to complement the flip-flops 20, 30 and 40. The $\overline{\text{AND}}$ gate 50 conditions the complement gate 60 whenever like signals are applied to input terminals 52 and 54 from the flip-flops 30 and 40, respectively. The complement gate 60 and the $\overline{\text{AND}}$ gate 50 are not illustrated in detail because such devices are well known in the art. They may take numerous forms, and for example, they may be diode type gates. An output signal is produced from the $\overline{\text{AND}}$ gate 50 when both of its input terminals are at ground potential which output signal conditions the complement gate 60 to pass a postive input pulse. Diodes 70 and 80 are connected between the complement gate 60 and the flip-flops 20 and 30, respectively. These diodes are arranged to block the passage therethrough of pulses from the inhibit gates 18 and 28.

The flip-flop 10 employs a pair of transistors 100 and 102 the collectors of which are connected through resistors 108 and 110, respectively, to a positive potential source. The emitter of the transistor 100 is connected directly to ground, and the emitter of the transistor 102 is connected to ground through a reset switch 126. Although the reset switch 126 is illustrated as the push button type, other mechanical or electronic type switches may be employed. The base of the transistor 100 is connected to ground through a resistor 112, and the base of the transistor 102 is connected to ground through a resistor 114. The transistors are cross-coupled by a resistor 106 connected between the base of the transistor 100 and the collector of the transistor 102, and a resistor 104 connected between the base of the transistor 102 and the collector of the transistor 100. Diodes 116 and 118 are connected at one end to the base electrode of the transistors 100 and 102, respectively, and at the other end to a coupling capacitor 120 which is connected to a trigger or complement input 11. A One output terminal 13 is connected to the junction of the resistors 108 and 104 and a Zero output terminal 14 is connected to the junction of resistors 110 and 106. Each of the other flip-flops 20, 30 and 40 includes the same circuit as that shown for the flip-flop 10. Each of the flip-flops is designed such that a positive potential at terminal 13 represents a One (transistor 100 is nonconducting) and a positive potential at the terminal 14 represents a Zero (transistor 102 is nonconducting). A positive input pulse applied to the trigger input terminal 11 causes the flip-flop to switch from one state to the other. It is to be understood that although a particular circuit is shown for the flip-flop 10, other transistorized bistable circuits may be employed as desired.

According to another feature of the invention, whenever the reset switch 126 is depressed the Zero transistor of each flip-flop is ungrounded. This action renders the Zero transistor nonconducting, and thus resets each of the flip-flops to the Zero state.

The inhibit gate 18 includes a diode 130, an input resistor 132 and a coupling capacitor 134 connected as shown. These components are arranged such that a bias from the flip-flop 10 may be applied to the cathode of the diode 130 through the resistor 132. When such a bias is applied to the gate 18, an input pulse applied to the anode of the diode 130 is blocked. Whenever the bias is removed the input pulse is passed by the diode 130, and this pulse is applied to the next succeeding stage through the coupling capacitor 134. The inhibit gates 28 and 38 are identical to the inhibit gate 18 and operate in the same manner. According to a further feature of this invention, this gating arrangement requires negligible current in the input of the gate and allows a high impedance (resistor 132) to be employed between the cathode of the diode and the output of the associated flip-flop. This high impedance prevents the counter from changing its accumulated total when the position of the add-subtract mode switch is changed. It is pointed out that other type inhibit gates may be employed without departing from the instant invention.

In the operation of the decade counter, ten of the sixteen possible binary states of the four flip-flops are used. At a decimal count of four in the add mode, and five in the subtract mode, the next pulse is fed to all four flip-flops thereby complementing each of them. Input pulses cause the binary state of the counter to advance from 0 through 4 and then 11 through 15 in the add mode. When the counter is operating in the subtract mode, the binary state decreases from 15 through 11 and then 4 through 0. As will be apparent this scheme greatly reduces the total number of components that are required in the counter.

By reference to the drawing and to the following Table I, the operation of the counter in the add mode is as follows:

*Table I*

| Counter Input Pulses | Decimal Value | Flip-Flops | | | |
|---|---|---|---|---|---|
| | | 10 | 20 | 30 | 40 |
| 0 | 0 | 0 | 0 | 0 | 0 |
| 1 | 1 | 0 | 0 | 0 | 1 |
| 2 | 2 | 0 | 0 | 1 | 0 |
| 3 | 3 | 0 | 0 | 1 | 1 |
| 4 | 4 | 0 | 1 | 0 | 0 |
| 5 | 5 | 1 | 0 | 1 | 1 |
| 6 | 6 | 1 | 1 | 0 | 0 |
| 7 | 7 | 1 | 1 | 0 | 1 |
| 8 | 8 | 1 | 1 | 1 | 0 |
| 9 | 9 | 1 | 1 | 1 | 1 |
| 10 | 10 | 0 | 0 | 0 | 0 |

In the above Table I, a numeral 0 or a numeral 1 indicates that the flip-flop is in the Zero or One state, respectively. It is assumed that all of the flip-flops are reset to Zero by the reset switch 126 which renders all of the right hand, or Zero, transistors nonconductive to thus reset all four flip-flops to Zero. Each of the inhibit gates 18, 28 and 38 is biased with a positive potential from the Zero terminals 12, 22 and 32, respectively, of the flip-flops. The first input pulse is blocked by the inhibit gate 18 and the complement gate 60. An input pulse is passed by the complement gate 60 only when it is conditioned by the $\overline{\text{AND}}$ gate 50 as will be subsequently explained in greater detail. This first input pulse, which is also applied to the trigger input 11 of the flip-flop 10, causes the flip-flop 10 to change from Zero to One as indicated in the above Table I. When the flip-flop 10 changes its state from Zero to One, the positive bias applied to the inhibit gate 18 is removed. The second input pulse therefore may flow through the gate 18, but is blocked by the gate 28 which still has a positive bias applied thereto from the flip-flop 20. This second pulse changes the state of each of the flip-flops 10 and 20. When the flip-flops 10 and 20 change state, a positive bias is reapplied to the inhibit gate 18 and removed from the inhibit gate 28. The third pulse is blocked by the inhibit gate 18 and, therefore, this pulse causes only the flip-flop 10 to change state from Zero to One. The fourth input pulse finds the inhibit gates 18 and 28 unbiased and hence this pulse changes the states of the flip-flops 10, 20 and 30. As illustrated in Table I, after the fourth pulse the flip-flop 40 is in the Zero state, the flip-flop 30 is in the One state, the flip-flop 20 is in the Zero state and the flip-flop 10 is in the Zero state.

The fourth input pulse in the add mode conditions the counter so that the next input pulse, the fifth, complements the counter. After the fourth pulse the potential on each of the input terminals 52 and 54 of the $\overline{\text{AND}}$ gate 50 is the same, since the input terminal 52 is connected to the Zero side of the flip-flop 30 which is now at a zero potential, and the input terminal 54 is connected to the One side of the flip-flop 40 which is at zero potential. This coincidence of inputs to the $\overline{\text{AND}}$ gate 50 produces an output from that gate which conditions the complement gate 60 to pass the next input pulse. This next input pulse (the fifth) complements the counter since it is applied directly to the flip-flop 10, applied to the flip-flops 20 and 30 through the diodes 70 and 80, respectively, and applied to the flip-flop 40 through the inhibit gate 38. Thus, it should be apparent from the above description and Table I that the fifth pulse, or the decimal number 5, is represented by a binary count of eleven in the counter. The subsequent sixth, seventh, eighth and ninth pulses each add one to the count in the counter. The numbers stored in the counter at any time may be read out by sampling either of the output terminals of each of the flip-flops 10, 20, 30 and 40. For example, a neon indicator device may be connected from each of the One output terminals 13, 23, 33 and 43 to ground. With such an arrangement the neon devices light whenever their respective flip-flops are in the One state.

The operation of the bidirectional decade counter of the present invention in the subtract mode is essentially the same as the operation in the add mode. To subtract, the mode switches 16, 26, 36 and 46 are each moved to their left-hand position, i.e., connected to terminals 13, 23, 33 and 42, respectively.

By reference to the drawing and to the following Table II, the operation of the counter in the subtract mode is as follows:

*Table II*

| Counter Input Pulses | Decimal Value | Flip-Flops | | | |
|---|---|---|---|---|---|
| | | 10 | 20 | 30 | 40 |
| 0 | 10 | 0 | 0 | 0 | 0 |
| 1 | 9 | 1 | 1 | 1 | 1 |
| 2 | 8 | 1 | 1 | 1 | 0 |
| 3 | 7 | 1 | 1 | 0 | 1 |
| 4 | 6 | 1 | 1 | 0 | 0 |
| 5 | 5 | 1 | 0 | 1 | 1 |
| 6 | 4 | 0 | 1 | 0 | 0 |
| 7 | 3 | 0 | 0 | 1 | 1 |
| 8 | 2 | 0 | 0 | 1 | 0 |
| 9 | 1 | 0 | 0 | 0 | 1 |
| 10 | 0 | 0 | 0 | 0 | 0 |

In the above Table II, a numeral 0 or a numeral 1 indicates that the flip-flop is in the Zero or One state, respectively. It is assumed that all of the flip-flops are reset to Zero by the reset switch 126 which renders all of the right-hand transistors nonconductive to thus reset all four flip-flops to the Zero state.

The first input pulse finds each of the inhibit gates 18, 28 and 38 unbiased and, therefore, this pulse is applied to each of the flip-flops 10, 20, 30 and 40. This first pulse thus causes each of the flip-flops to change state, and leaves each of the flip-flops in the One state. The second input pulse finds each of the inhibit gates 18, 28 and 38 biased since a positive potential is applied to each of these gates from the output terminals 13, 23 and 33, respectively. This second pulse causes only the flip-flop 10 to change state. Each subsequent input pulse subtracts one from the count in the counter as illustrated in the above Table II. When the decimal value 5 is established in the counter, the potentials applied to each of the input terminals 52 and 54 of the $\overline{\text{AND}}$ gate 50 from the flip-flops 30 and 40, respectively, is the same. Upon the application of coincident inputs to the $\overline{\text{AND}}$ gate 50, this gate conditions the complement gate 60 to pass the next input pulse which complements the counter. This next input pulse is applied directly to the flip-flop 10, is applied to the flip-flops 20 and 30 through the diodes 70 and 80, respectively, and is applied to the flip-flop 40 through the inhibit gate 38, thereby leaving a count of four in the counter. Subsequent input pulses continue to subtract one from the count in the counter.

It is seen that a transistorized bidirectional decade counter is provided by the present invention in which each input pulse increases the count by one in the add mode and decreases the count by one in the subtract mode. The counter employs a single set of gates and a switching arrangement to switch these gates from the Zero to the One side, or vice versa, of certain of the flip-flops in the counter to control whether the counter adds or subtracts. Another set of gates are used to complement the flip-flops after the occurrence of a particular count in the counter. The binary count represented by the counter increases from 0 through 4, then 11 through 15 when adding, and decreases from 15 through 11, then 4 through 0 when subtracting. This switching and counting arrangement greatly reduces the number of components required. The counter is reset by ungrounding one of the transistors of each flip-flop thereby resulting in a further reduction of components.

What is claimed is:

1. A bidirectional counter comprising: a plurality of stages each of which includes a bistable device having an input and at least one output; a plurality of gate means for gating pulses; first means connecting a first of said gate means to a first of said bistable devices, a second of said bistable devices, and a second of said gate means; second means connecting said second gate means to said second bistable device, a succeeding bistable device and a succeeding gate means; third means connecting said succeeding gate means to said succeeding bistable device and a last of said bistable devices; a first gate; a second gate; means connecting said first and second gates whereby the first gate is conditioned by the second gate; fourth means to apply pulses to said first bistable device, said first gate means and said first gate; fifth means connecting said succeeding bistable device and said last bistable device to said second gate; and means connecting said first gate to said second bistable device and to said succeeding bistable device; whereby certain of said bistable devices change state upon the application of input pulses by said fourth means.

2. A bidirectional counter as in claim 1 wherein each of said first, second, third and fifth means includes a switch all of which are operated together to provide a count-up or a count-down operation of said counter.

3. A bidirectional counter as in claim 1 wherein each of said bistable devices includes a pair of transistors each of which is connected to ground; and said counter is reset by simultaneously removing the ground connection of one of said transistors of each of said bistable devices.

4. A bidirectional decade counter comprising: four stages each of which includes a bistable device having an input and two outputs, and three of said stages each includes a gate device; said gate devices being connected in series; a complement gate; an $\overline{\text{AND}}$ gate; a two-state switch means connected to one of the outputs on each of said bistable devices to connect the counter to count up or count down; means for receiving input pulses connected to a first of said bistable devices, a first of said gate devices and said complement gate; means connecting said gate devices to three of said bistable devices including said switch means whereby the states of the bistable devices condition the gate devices to pass or block said input pulses; the gate device of each stage being adapted to apply a pulse to the bistable device of the next succeeding stage; and said $\overline{\text{AND}}$ gate being connected to the switch means of the third and fourth bistable devices and to said complement gate to condition said complement gate to pass an input pulse when said third and fourth bistable devices are in predetermined states; whereby said counter counts up when said switch means is in a first of said two states and counts down when said switch means is in a second of said two states.

5. A counter comprising: a plurality of flip-flops each of which includes a pair of transistors; first means to apply input pulses to the transistors of each of said flip-flops including a plurality of gates each conditioned by said flip-flops to pass or block said input pulses; second means to complement certain of said flip-flops; a mode switch means connected between a first group of said flip-flops and said gates, and between a second group of said flip-flops and said second means to set the counter to count up or count down; whereby input pulses applied to the counter add to or subtract from the value in the counter depending upon the state of the mode switch, and each of the flip-flops of said counter is complemented by an input pulse when the flip-flops are in a predetermined state.

6. A counter as in claim 5 wherein each of said transistors is grounded and the counter is reset by ungrounding one transistor of each pair of transistors.

7. A counter as in claim 5 wherein said gates include a high impedance and said gates are connected through this impedance to said first group of flip-flops.

8. A bidirectional counter comprising: a plurality of transistor flip-flops having at least a pair of output terminals; a set of gates; switch means connecting each of said gates to one or another of each of said output terminals on each of a group of said plurality of flip-flops to cause the counter to add or subtract, respectively; means applying pulses to the counter whereby the count in the counter increases or decreases; and gate means connecting another group of said plurality of flip-flops to complement certain of the flip-flops when all of the flip-flops are in a predetermined state.

9. A bidirectional counter as in claim 8 wherein the binary count in said counter increases from 0 through 4 and then 11 through 15 when adding; and decreases from 15 through 11 and then 4 through 0 when subtracting.

References Cited in the file of this patent

UNITED STATES PATENTS

| | | |
|---|---|---|
| 2,816,226 | Forrest et al. | Dec. 10, 1957 |
| 2,841,705 | Moerman | July 1, 1958 |
| 2,931,922 | Tubinis | Apr. 5, 1960 |
| 2,977,539 | Townsend | Mar. 28, 1961 |

FOREIGN PATENTS

| | | |
|---|---|---|
| 596,670 | Great Britain | Jan. 8, 1948 |